United States Patent
Enquist et al.

(10) Patent No.: US 11,631,586 B2
(45) Date of Patent: *Apr. 18, 2023

(54) HETEROGENEOUS ANNEALING METHOD

(71) Applicant: ADEIA SEMICONDUCTOR BONDING TECHNOLOGIES INC., San Jose, CA (US)

(72) Inventors: Paul M. Enquist, Cary, NC (US); Gaius Gillman Fountain, Youngsville, NC (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/914,169

(22) Filed: Jun. 26, 2020

(65) Prior Publication Data
US 2020/0328193 A1    Oct. 15, 2020

Related U.S. Application Data

(60) Continuation of application No. 15/639,194, filed on Jun. 30, 2017, now Pat. No. 10,777,533, which is a
(Continued)

(51) Int. Cl.
*H01L 21/20* (2006.01)
*H01L 23/498* (2006.01)
(Continued)

(52) U.S. Cl.
CPC ...... *H01L 21/2007* (2013.01); *H01L 21/6835* (2013.01); *H01L 21/76898* (2013.01);
(Continued)

(58) Field of Classification Search
CPC . H01L 25/0657; H01L 21/6835; H01L 24/32; H01L 24/83; H01L 21/76898;
(Continued)

(56) References Cited

U.S. PATENT DOCUMENTS 3,175,025 A    3/1965    Geen et al.
3,423,823 A    1/1969    Ansley
(Continued)

FOREIGN PATENT DOCUMENTS

EP    0823780 A1    2/1998
EP    0616426 B1    9/1998
(Continued)

OTHER PUBLICATIONS

Amirfeiz et al., "Formation of silicon structures by plasma-activated wafer bonding," Journal of the Electrochemical Society, 2000, vol. 147, No. 7, pp. 2693-2698.
(Continued)

*Primary Examiner* — Shouxiang Hu
(74) *Attorney, Agent, or Firm* — Knobbe, Martens, Olson & Bear, LLP

(57) ABSTRACT

A method of integrating a first substrate having a first surface with a first insulating material and a first contact structure with a second substrate having a second surface with a second insulating material and a second contact structure. The first insulating material is directly bonded to the second insulating material. A portion of the first substrate is removed to leave a remaining portion. A third substrate having a coefficient of thermal expansion (CTE) substantially the same as a CTE of the first substrate is bonded to the remaining portion. The bonded substrates are heated to facilitate electrical contact between the first and second contact structures. The third substrate is removed after heating to provided a bonded structure with reliable electrical contacts.

22 Claims, 6 Drawing Sheets

Related U.S. Application Data division of application No. 14/879,800, filed on Oct. 9, 2015, now Pat. No. 9,698,126, which is a continuation of application No. 14/064,807, filed on Oct. 28, 2013, now Pat. No. 9,184,125, which is a division of application No. 13/599,023, filed on Aug. 30, 2012, now Pat. No. 8,735,219.

(51) Int. Cl.

| | | |
|---|---|---|
| *H01L 21/768* | (2006.01) | |
| *H01L 25/00* | (2006.01) | |
| *H01L 49/02* | (2006.01) | |
| *H01L 27/06* | (2006.01) | |
| *H01L 21/683* | (2006.01) | |
| *H01L 23/00* | (2006.01) | |
| *H01L 25/065* | (2023.01) | |

(52) U.S. Cl.
CPC ........ *H01L 23/49866* (2013.01); *H01L 24/32* (2013.01); *H01L 24/83* (2013.01); *H01L 25/0657* (2013.01); *H01L 25/50* (2013.01); *H01L 27/0688* (2013.01); *H01L 28/26* (2013.01); *H01L 2221/68359* (2013.01); *H01L 2224/29147* (2013.01); *H01L 2224/29155* (2013.01); *H01L 2224/83053* (2013.01); *H01L 2224/83201* (2013.01); *H01L 2225/06541* (2013.01); *H01L 2924/0002* (2013.01)

(58) Field of Classification Search
CPC ................ H01L 25/50; H01L 21/2007; H01L 23/49866; H01L 2224/29147; H01L 2221/68359; H01L 2225/06541; H01L 2224/29155; H01L 2224/83053; H01L 2224/83201; H01L 2924/0002; H01L 24/81; H01L 24/16; H01L 24/73; H01L 24/26; H01L 24/29; H01L 27/0688; H01L 24/09
See application file for complete search history.

(56) References Cited

U.S. PATENT DOCUMENTS

| | | | |
|---|---|---|---|
| 4,612,083 | A | 9/1986 | Yasumoto et al. |
| 4,818,728 | A | 4/1989 | Rai et al. |
| 5,451,547 | A | 9/1995 | Himi et al. |
| 5,668,057 | A | 9/1997 | Eda et al. |
| 5,747,857 | A | 5/1998 | Eda et al. |
| 5,753,536 | A | 5/1998 | Sugiyama et al. |
| 5,771,555 | A | 6/1998 | Eda et al. |
| 6,080,640 | A | 6/2000 | Gardner et al. |
| 6,180,496 | B1 | 1/2001 | Farrens et al. |
| 6,423,640 | B1 | 7/2002 | Lee et al. |
| 6,465,892 | B1 | 10/2002 | Suga |
| 6,495,398 | B1 | 12/2002 | Goetz |
| 6,502,271 | B1 | 1/2003 | Epshteyn |
| 6,645,828 | B1 | 11/2003 | Farrens et al. |
| 6,877,209 | B1 | 4/2005 | Miller et al. |
| 6,887,769 | B2 | 5/2005 | Kellar et al. |
| 6,908,027 | B2 | 6/2005 | Tolchinsky et al. |
| 6,908,832 | B2 | 6/2005 | Farrens et al. |
| 7,037,804 | B2 | 5/2006 | Kellar et al. |
| 7,045,453 | B2 | 5/2006 | Canaperi et al. |
| 7,105,980 | B2 | 9/2006 | Abbott et al. |
| 7,109,092 | B2 | 9/2006 | Tong |
| 7,126,212 | B2 | 10/2006 | Enquist et al. |
| 7,192,841 | B2 | 3/2007 | Wei et al. |
| 7,193,423 | B1 | 3/2007 | Dalton et al. |
| 7,213,314 | B2 | 5/2007 | Abbott et al. |
| 7,230,512 | B1 | 6/2007 | Carpenter et al. |
| 7,335,572 | B2 | 2/2008 | Tong et al. |
| 7,466,022 | B2 | 12/2008 | Miller et al. |
| 7,602,070 | B2 | 10/2009 | Tong et al. |
| 7,750,488 | B2 | 7/2010 | Patti et al. |
| 7,803,693 | B2 | 9/2010 | Trezza |
| 8,035,464 | B1 | 10/2011 | Abbott et al. |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,735,219 | B2 * | 5/2014 | Enquist ............... H01L 27/0688 257/782 |
| 8,802,538 | B1 | 8/2014 | Liu |
| 8,809,123 | B2 | 8/2014 | Liu et al. |
| 8,988,299 | B2 | 3/2015 | Kam et al. |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,368,866 | B2 | 6/2016 | Yu |
| 9,385,024 | B2 | 7/2016 | Tong et al. |
| 9,394,161 | B2 | 7/2016 | Cheng et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,698,126 | B2 * | 7/2017 | Enquist ................... H01L 25/50 |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,881,882 | B2 | 1/2018 | Hsu et al. |
| 9,893,004 | B2 | 2/2018 | Yazdani |
| 9,899,442 | B2 | 2/2018 | Katka |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,177,735 | B2 | 1/2019 | Ruby et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,454,447 | B2 | 10/2019 | Solal et al. |
| 10,508,030 | B2 | 12/2019 | Katkar et al. |
| 10,522,499 | B2 | 12/2019 | Enquist et al. |
| 10,707,087 | B2 | 7/2020 | Uzoh et al. |
| 10,727,219 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |

(56) References Cited

U.S. PATENT DOCUMENTS

| | | |
|---|---|---|
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katka |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 2001/0037995 A1 | 11/2001 | Akatsu et al. |
| 2002/0030198 A1 | 3/2002 | Coman et al. |
| 2002/0048900 A1 | 4/2002 | Lo et al. |
| 2002/0068396 A1 | 6/2002 | Fitzergald |
| 2003/0022412 A1 | 1/2003 | Higgins et al. |
| 2003/0030119 A1 | 2/2003 | Higgins, Jr. et al. |
| 2004/0084414 A1 | 5/2004 | Sakai et al. |
| 2006/0057945 A1 | 3/2006 | Hsu et al. |
| 2006/0076559 A1 | 4/2006 | Faure et al. |
| 2006/0121696 A1 | 6/2006 | Shiota et al. |
| 2006/0138907 A1 | 6/2006 | Koizumi et al. |
| 2006/0199353 A1 | 9/2006 | Kub et al. |
| 2006/0255341 A1 | 11/2006 | Pinnington et al. |
| 2006/0273068 A1 | 12/2006 | Maunand Tussot et al. |
| 2006/0284167 A1 | 12/2006 | Augustine et al. |
| 2007/0096294 A1 | 5/2007 | Ikeda et al. |
| 2007/0111386 A1 | 5/2007 | Kim et al. |
| 2007/0222048 A1 | 9/2007 | Huang |
| 2007/0295456 A1 | 12/2007 | Gudeman et al. |
| 2009/0004822 A1 | 1/2009 | Murakami et al. |
| 2009/0042356 A1 | 2/2009 | Takayama et al. |
| 2009/0068831 A1 | 3/2009 | Enquist et al. |
| 2009/0191719 A1 | 7/2009 | Dupont |
| 2009/0321869 A1 | 12/2009 | Fukuoka et al. |
| 2011/0053339 A1 | 3/2011 | Ozawa |
| 2011/0128399 A1 | 6/2011 | Fujii |
| 2011/0290552 A1 | 12/2011 | Palmateer et al. |
| 2012/0003813 A1 | 1/2012 | Chuang et al. |
| 2012/0028440 A1 | 2/2012 | Castex et al. |
| 2012/0077329 A1 | 3/2012 | Broekaart et al. |
| 2012/0119224 A1 | 5/2012 | Tai et al. |
| 2012/0168792 A1 | 7/2012 | Kang et al. |
| 2012/0183808 A1 | 7/2012 | Tong |
| 2012/0212384 A1 | 8/2012 | Kam et al. |
| 2012/0270231 A1 | 10/2012 | Smith et al. |
| 2013/0130473 A1 | 5/2013 | Ben Mohamed et al. |
| 2013/0228775 A1 | 9/2013 | Noda et al. |
| 2014/0167230 A1 | 6/2014 | Kitada et al. |
| 2014/0175655 A1 | 6/2014 | Chen et al. |
| 2014/0225795 A1 | 8/2014 | Yu |
| 2015/0064498 A1 | 3/2015 | Tong |
| 2016/0049384 A1 | 2/2016 | Lu et al. |
| 2016/0343682 A1 | 11/2016 | Kawasaki |
| 2017/0036419 A1 | 2/2017 | Adib et al. |
| 2017/0062366 A1 | 3/2017 | Enquist |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0338143 A1 | 11/2017 | Peidous et al. |
| 2017/0338214 A1 | 11/2017 | Uzoh et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0123709 A1 | 4/2019 | Inoue et al. |
| 2019/0131277 A1 | 5/2019 | Yang et al. |
| 2019/0157333 A1 | 5/2019 | Tsai |
| 2019/0164919 A1 | 5/2019 | Hu et al. |
| 2019/0170631 A1 | 6/2019 | Shachar et al. |
| 2019/0198407 A1 | 6/2019 | Huang et al. |
| 2019/0198409 A1 | 6/2019 | Katkar et al. |
| 2019/0221607 A1 | 7/2019 | Gudeman |
| 2019/0265411 A1 | 8/2019 | Huang et al. |
| 2019/0288660 A1 | 9/2019 | Goto et al. |
| 2019/0295883 A1 | 9/2019 | Yokokawa |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0006145 A1 | 1/2020 | Li et al. |
| 2020/0006266 A1 | 1/2020 | Chen et al. |
| 2020/0013637 A1 | 1/2020 | Haba |
| 2020/0013765 A1 | 1/2020 | Fountain, Jr. et al. |
| 2020/0028486 A1 | 1/2020 | Kishino et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |

(56) References Cited

U.S. PATENT DOCUMENTS

2022/0319901 A1 10/2022 Suwito et al.
2022/0320035 A1 10/2022 Uzoh et al.
2022/0320036 A1 10/2022 Gao et al.

FOREIGN PATENT DOCUMENTS

| EP | 0591918 B1 | 7/1999 |
|---|---|---|
| JP | 2011-200933 | 10/2011 |
| JP | 2013-33786 | 2/2013 |
| JP | 2018-160519 | 10/2018 |
| KR | 10-2015-0097798 | 8/2015 |
| KR | 10-2018-0114896 | 10/2018 |
| WO | WO 2004/021398 A2 | 3/2004 |
| WO | WO 2005/043584 A2 | 5/2005 |
| WO | WO 2006/100444 A1 | 9/2006 |
| WO | WO 2015/191082 A1 | 12/2015 |
| WO | WO 2017/151442 A1 | 9/2017 |

OTHER PUBLICATIONS

Bengtsson, S. et al., "Low Temperature Bonding," International Conference on Compliant & Alternative Substrate Technology, Meeting Program & Abstract Book, Sep. 29-23, p. 10.

Farrens et al., "Chemical Free Room Temperature Wafer to Wafer Direct Bonding", J. Electrochem. Soc., vol. 142, No. 11, Nov. 1995, pp. 3949-3955.

Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.

Gösele, U. et al., "Semiconductor Wafer Bonding, a Flexible Approach to Materials Combinations in Microelectronics, Micromechanics and Optoelectronics", 1997 IEEE, pp. 23-32.

Reiche et al., "The effect of a plasma pretreatment on the Si/Si bonding behaviouir," Electrochemical Society Proceedings, 1998, vol. 97-36, pp. 437-444.

International Search Report and Written Opinion dated Feb. 7, 2014 in PCT/US2013/057536 filed Aug. 30, 2013.

International Search Report and Written Opinion dated Mar. 7, 2019, in International Application No. PCT/US2018/060044, 14 pages.

International Search Report and Written Opinion dated Apr. 22, 2019 in International Application No. PCT/US2018/064982, 13 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.

Plobi, A. et al., "Wafer direct bonding: tailoring adhesion between brittle materials," Materials Science and Engineering Review Journal, 1999, R25, 88 pages.

Darling, R.B., "Wafer Bonding," EE-527: Microfabrication, Winter 2013, 32 pages.

Mizumoto et al., Direct wafer bonding and its application to waveguide optical isolators, Department of Electrical and Electronic Engineering, Tokyo Institute of Technology, Materials, ISSN: 1996-1944, www.mdpi.com/journal/materials, Mar. 31, 2012, pp. 985-1004.

Suga et al., "Combined process for wafer direct bonding by means of the surface activation method," IEEE, 2004, pp. 484-490.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takei et al., "Effects of wafer precleaning and plasma irradiation to wafer surfaces on plasma-assisted surface-activated direct bonding," Japanese Journal of Applied Physics, 2010, vol. 49, pp. 1-3.

"Wafer Bonding—An Overview," ScienceDirect Topics, Journals & Books, https://www.sciencedirect.com/topics/engineering/wafer-bonding, printed Jun. 27, 2019, 12 pages.

Taylor, S. et al., "A review of the plasma oxidation of silicon and its applications," Semicond. Sci. Technol., 1993, vol. 8, pp. 1426-1433.

Shen et al., "Structure and magnetic properties of Ce-substituted yttrium iron garnet prepared by conventional sintering techniques," J Supercond, 2017, pp. 937.

Vasili et al., "Direct observation of multivalent states and 4 f—3d charge transfer in Ce-doped yttrium iron garnet thin films," Physical Review, 2017, pp. 1-10.

\* cited by examiner

HETEROGENEOUS ANNEALING METHOD

CROSS-REFERENCE TO RELATED APPLICATIONS

This application is a continuation of and claims the benefit of priority under 35 U.S.C. § 120 from U.S. Ser. No. 15/639,194, filed Jun. 30, 2017, which is a divisional of and claims the benefit of priority under 35 U.S.C. § 120 from U.S. Ser. No. 14/879,800, filed Oct. 9, 2015, issued as U.S. Pat. No. 9,698,126, which is a continuation of and claims the benefit of priority under 35 U.S.C. § 120 from U.S. Ser. No. 14/064,807, filed Oct. 28, 2013, issued as U.S. Pat. No. 9,184,125, which is a divisional of and claims the benefit of priority under 35 U.S.C. § 120 from U.S. Ser. No. 13/599,023, filed Aug. 30, 2012, issued as U.S. Pat. No. 8,735,219, the contents of each of which are incorporated by reference herein in their entirety and for all purposes.

This application is also related to U.S. Pat. Nos. 6,902,987; 6,932,835; 7,041,178; 7,335,996; 7,387,944; 7,485,968; 7,602,070; 7,807,548; 7,842,540; 7,871,898; and 8,053,329 and application Ser. Nos. 12/270,585; 12/913,385; 12/954,740 and 13/341,273, the entire contents of each of which are incorporated herein by reference.

BACKGROUND OF THE INVENTION

Field of the Invention

The present invention relates to the field of three-dimensional integrated circuits and more particularly to devices and the fabrication thereof of three-dimensional integrated circuits using direct wafer bonding.

Description of the Related Art

Semiconductor integrated circuits (ICs) are typically fabricated into and on the surface of a silicon wafer resulting in an IC area that must increase as the size of the IC increases. Continual improvement in reducing the size of transistors in ICs, commonly referred to as Moore's Law, has allowed a substantial increase in the number of transistors in a given IC area. However, in spite of this increased transistor density, many applications require an increase in total IC area due to a greater increase in required transistor count or an increase in the number of lateral interconnections required between transistors to achieve a specific function. The realization of these applications in a single, large area IC die typically results in a reduction in chip yield and, correspondingly, increased IC cost.

Another trend in IC fabrication has been to increase the number of different types of circuits within a single IC, more commonly referred to as a System-on a-Chip (SoC). This fabrication typically requires an increase in the number of mask levels to make the different types of circuits. This increase in mask levels typically also results in a reduction in yield, and correspondingly, increased IC cost. A solution to avoiding these undesired decreases in yield and increases in cost is to vertically stack and vertically interconnect ICs. These ICs can be of different size, come from different size wafers, comprise different functions (i.e., analog, digital, optical), be made of different materials (i.e., silicon, GaAs, InP, etc.). The ICs can be tested before stacking to allow Known Good Die (KGD) to be combined to improve yield. The economic success of this vertical stacking and vertical interconnect, or three-dimensional 3D SoC, approach depends on the yield and cost of the stacking and interconnection being favorable compared to the yield and cost associated with the increased IC or SoC area. A manufacturable method for realizing this approach is to vertically stack separately fabricated ICs using direct bonding where the direct bonding surface preparation uses conventional wafer fabrication techniques, for example, metal deposition, dielectric deposition, chemo-mechanical polishing, wafer thinning, photolithography masking, and via etching. A further advantage of using direct bonding for 3D SoC fabrication is the ability to achieve a scalable density of vertical interconnections between different layers or tiers of the stack as a result of the direct bond process.

Direct bonding requires a substantially planar surface that does not result from typical IC wafer fabrication. Achieving an adequate wafer planarization can thus be a substantial element of cost in a direct bond process. It is thus desirable to have a device that comprises a structure and a method to fabricate said structure requiring a minimum cost to achieve this required surface planarity.

Metal direct bonding includes methods and devices for forming 3D structures wherein electrically isolated electrical interconnections can be made across a bond interface which can be formed by aligning and placing two surfaces of two elements into direct contact. Each surface can have insulating and conducting portions and aligned conducting portions can result in a 3D electrical interconnection across the bond interface, and aligned insulating portions can isolate 3D electrical interconnections from other 3D electrical interconnections.

The details of making of a 3D electrical interconnections across the bond interface depends on the relative planarity of the insulating and conducting portions. For example, if the conducting portions are higher than the insulating portions, a 3D interconnection can be made by simply placing two surfaces into contact, for example if the there is not a native oxide on the conducting portion preventing a 3D interconnection and the extension of the conducting portion above the insulating portion is sufficiently small that insulating portions can also bond in direct contact with surface compliance. 3D interconnections may also not be made by simply placing two surfaces into contact, for example if the conducting portions are lower than the insulating portions such that the conducting portions do not come into contact when the surfaces are place together. In this example, 3D interconnections can be made with a slight increase in temperature due to the coefficient of thermal expansion (CTE) difference between the conducting and insulating portion and an adequate bond energy between insulating components that sufficiently compresses the conducting components during heating if the elements are of standard thickness. If the CTE of the elements are comparable, the slight increase in temperature to make a connection can be accommodated by the bond energy of the insulating portions that are in contact and the stiffness of the element. If the CTE of the elements are not comparable, for example for some heterogeneous material combinations, high bond energy of the insulating portions in contact can result in fracture of one or both of the elements during the heating used to make the 3D interconnections. This fracture can be avoided by thinning one of the elements sufficiently prior to heating. This thinning increases the compliance of the element by reducing its stiffness so that it can accommodate the CTE difference of the elements. Thinning to accommodate this difference in CTE can result in a reduced stiffness of the element such that compression is not adequate to make a 3D interconnection.

SUMMARY OF THE INVENTION

The present invention is directed to a compression device and method that will facilitate formation of direct bonded 3D interconnections between two elements when heated where one or both elements are thinned sufficiently to compromise the stiffness of the thinned element or elements that is required to make a 3D interconnection across a bond interface between the two elements.

In one example of the method and device, two heterogeneous wafers containing semiconductor material with different CTE have surfaces suitably prepared for metal direct bonding wherein the conductive metal portion or portions of the surface are below the insulating portion or portions. The wafers are aligned and placed into contact and the insulating portions form a direct bond with high bond energy. A first wafer is then thinned, but the thinning reduces the stiffness of the thinned wafer below that required to reliably form 3D interconnections. A third wafer with a CTE comparable to the second wafer is then direct bonded to the thinned side of the first wafer, increasing the stiffness of the thinned wafer, and the bonded structure is heated, allowing 3D interconnections to form.

In a second example of the method and device, two heterogeneous wafers containing semiconductor material with different CTE have surfaces suitably prepared for metal direct bonding wherein the conductive metal portion or portions of the surface are below the insulating portion or portions. The wafers are aligned and placed into contact and the insulating portions form a direct bond with high bond energy. A first wafer is then thinned, but the thinning reduces the stiffness of the thinned wafer below that required to reliably form 3D interconnections. A third wafer with a CTE comparable to the second wafer is then clamped to the thinned side of the first wafer, increasing the stiffness of the thinned wafer, and the bonded structure is heated, allowing 3D interconnections with heating.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
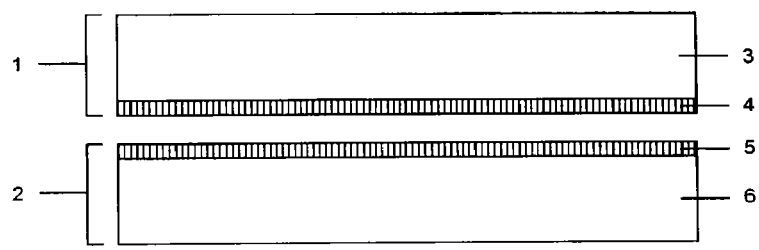
FIG. 1 is a diagram of two wafers with a major portion and a direct metal bond portion.

Referring now to the drawings, in particular FIG. 1, a first embodiment of the method according to the invention will be described. It is noted here that the drawings are not drawn to scale but are drawn to illustrate the concepts of the invention.

Figure 10A:
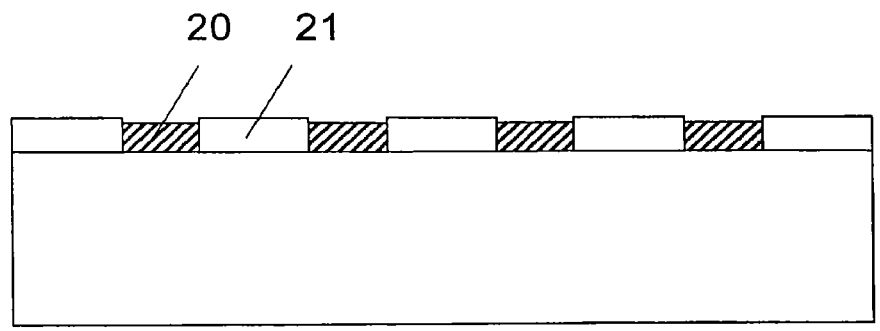
FIGS. 10A-10C are detailed views of the metal bonding region.
Figure 10B:
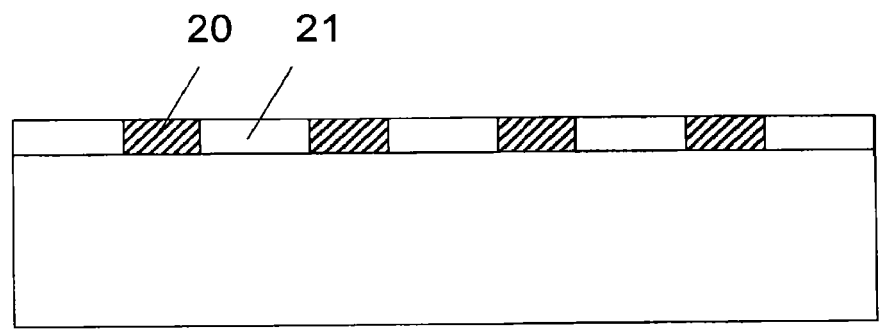
Figure 10C:
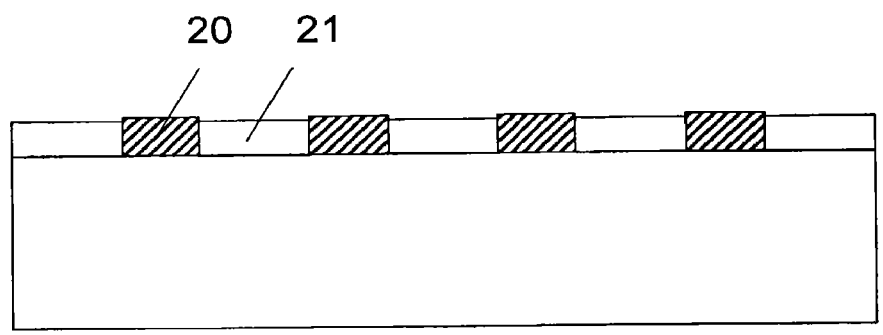

Two wafers, 1 and 2 are prepared for bonding. The wafers are of different material, and have different CTE. Wafer 2 includes a major portion 6 and a direct metal bond portion 5. Direct metal bond portion 5 has a surface with insulating and metal portions. The insulating portions are preferably an oxide or nitride, and more preferably a silicon oxide or silicon nitride. The portion 5 is shown in more detail in FIGS. 10A-10C. Metal pads 20 may be below, flush or above the oxide or nitride material 21 depending upon the process conditions and desired configuration. In the case where chemo-mechanical polishing is used on the surface, the metal pads can be dished and have a surface below the surface of the oxide or nitride material or the oxide or nitride material can be dished and have a surface below the surface of the metal pads.

Major portion 6 can include substrate, device, and interconnect portions that are, for example, found in industry standard manufactured semiconductor wafers, such as CMOS wafers that typically are manufactured with a copper or aluminum back-end-of-line process. Wafer 1 includes a major portion 3 and a direct metal bond portion 4. Major portion 3 can include substrate, device, and contact portions that are, for example, found in industry standard gallium nitride-based hetero-epitaxial device structures grown on sapphire (GaN/sapphire) that have contacts formed to the hetero-epitaxial material.

Figure 2:
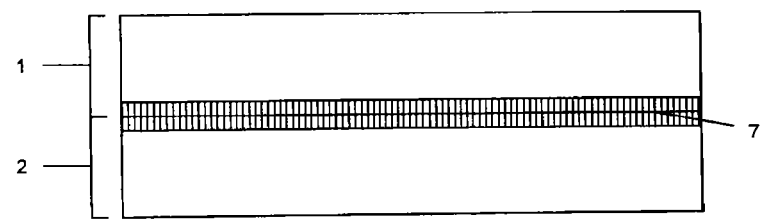
FIG. 2 is a diagram of two wafers with a major portion and a direct metal bond portion aligned and placed together forming a bond interface.

Wafer 1 and wafer 2 are direct metal bonded as described in application Ser. Nos. 09/505,283, 10/359,608 and 11/201,321, as shown in FIG. 2. If the surfaces of metal portions are below the surfaces of insulating portions, only the insulating portions may be in direct contact at interface 7 after the wafers are first placed into contact. The bonded wafers may then be heated to increase the bond energy between the bonded insulating portions, but not at too high a temperature for CTE induced strain to break the bond between the insulating portions or break the bonded wafers. The optimum temperature to increase bond energy will depend on the CTE difference and thickness of the wafers bonded. For example, when bonding a GaN/sapphire structure of approximate range 500-1000 micron sapphire thickness to silicon CMOS of approximate range 500-750 micron thickness, a temperature in the range of 75–150° C. may be preferable to achieve a bond energy of greater than 1 J/m$^2$ and preferably greater than 2 J/m$^2$. Higher temperatures are possible if a thinner material is used or materials with a lower CTE difference are used to facilitate achieving even higher bond energies greater 2.5 J/m$^2$. Although this temperature range can be sufficient to achieve a very high bond energy, it may not be sufficient to form 3D interconnections depending on the relative height of the metal and insulating portions and the type of metal used. For example, if copper is used, a temperature range of 150-250° C. may be required if the copper is 0-10 nm below a silicon oxide insulating portion. Alternatively, if nickel is used, a 250-350° C. temperature range may be required to make 3D interconnections if the nickel is 0-10 nm below a silicon oxide insulating portion. The lower temperature range requirement of the copper compared to the nickel is an example of where the type of metal can affect the temperature range wherein the higher expansion coefficient of copper (~17 ppm/° C.) compared to that of nickel (~13 ppm/° C.) results in more expansion at a given temperature resulting in a lower temperature range for a given difference in height between the metal and insulating portions of the bond surface Higher temperatures may thus be required to facilitate electrical interconnections while higher temperatures may not be possible with this configuration of bonded wafers due to CTE induced strain that would break the bond between the insulating portions or break the bonded wafers.

Figure 3:
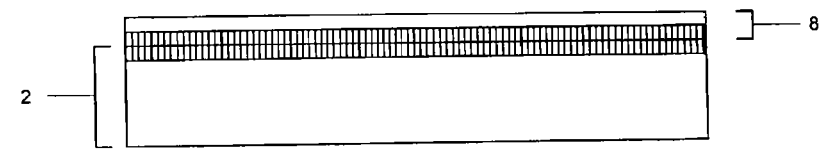
FIG. 3 is a diagram of two wafers with a major portion and a direct metal bond portion aligned and placed together forming a bond interface with a substantial portion of the major portion of one of the two wafers removed resulting in a thinned portion of a direct metal bonded pair.

Major portion 3 is then thinned as shown in FIG. 3 to form thinned layer 8 having a thickness typically in the range of 1-10 microns. The thickness of layer 8 may be outside this range depending upon the application and materials. For example, bonded material combinations with a low CTE mismatch of <2 ppm/° C. may allow a thicker layer 8 in the range of 10-100 microns and applications requiring the transfer of layers less than one micron may use a thinner layer 8 of 0.10-1.0 microns. Thinning may include one or a combination of backgrinding, polishing, etching, or laser liftoff. For example, if wafer 2 is a GaN/sapphire structure, laser liftoff can be used to remove the sapphire resulting in a very thin GaN device layer with metal contact portions. The thinned layer 8 allows heating to a higher temperature without breaking the bond between the insulating portions or breaking the bonded wafers due to increased compliance or elasticity. The allowed increased temperature depends on the materials and the reduced thickness of layer 8. For example, temperatures in excess of 350° C., for example 350° C. to 400° C., can be enabled by this thinning for bonded material that have a high CTE mismatch of 2-5 ppm/° C. and a layer 8 thickness of 2-20 microns. This increased temperature range enabled by reduced layer 8 thickness may be suitable to enable 3D interconnections or for other processing, for example oxide deposition or annealing. It is not necessary to use the full extent of this increased temperature range for other processing. For example, other processing below the maximum increased temperature range that is higher than that allowed prior to increasing the temperature range is possible.

In some cases, layer 8 may be too thin to provide adequate stiffness to produce adequate compression between metal portions at the surface of wafers 1 and 2 to form reliable 3D interconnections if wafers are heated to facilitate electrical interconnections. For example, if layer 8 is in the range of 1 to 10 microns thick, with an upper portion of this layer, for example 0.2 to 2.0 microns, comprising a heterogeneous combination of insulative and conductive bonding material, considerable stress normal to the bond interface in the vicinity of the interface between the insulating and conductive bonding material can be generated at low temperatures, for example less than 300° C., due to the CTE difference between insulative and conductive bonding material. This normal stress can distort the thin layer, resulting in less compressive force between metal portions and preventing electrical interconnections across the bond interface. This distortion results from a CTE mismatch induced extrusion of the conductive bonding material relative to the insulating bonding material at the thinned surface that is not constrained by the thinned layer due to the reduced stiffness of the thinned layer compared to that without partial or total removal of the substrate.

Figure 4:
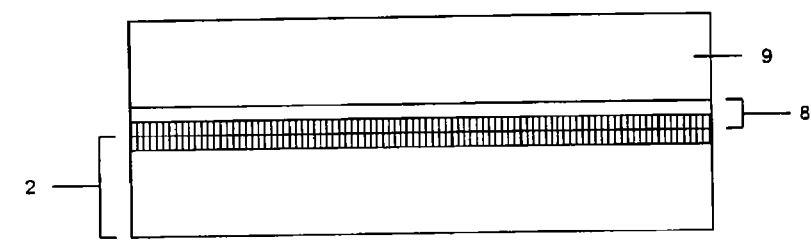
FIG. 4 is a diagram of a stiffening wafer attached to the thinned portion of a direct metal bonded pair.

This reduced stiffness can be compensated by bonding a third wafer 9 to thinned major portion 8 to reduce or prevent the distortion of layer 8 and enable adequate compression between metal portions at the surface of wafers 1 and 2 to form 3D interconnections with heating after the bonding of third wafer 9 as shown in FIG. 4. The minimum thickness of third wafer 9 required can be determined experimentally, however, this thickness will typically be less than a standard wafer thickness, for example 50-100 microns for 100-300 mm diameter wafers with standard thickness of about 0.5-0.8 mm as the stiffness is increased substantially with relatively small thickness being dependent on the cube of the thickness of third wafer 9. A reduced thickness of third wafer 9 may be obtained by thinning third wafer 9 before or after attaching. A wafer 9 thickness larger than the minimum thickness, for example a standard wafer thickness, may also be used.

Figure 11:
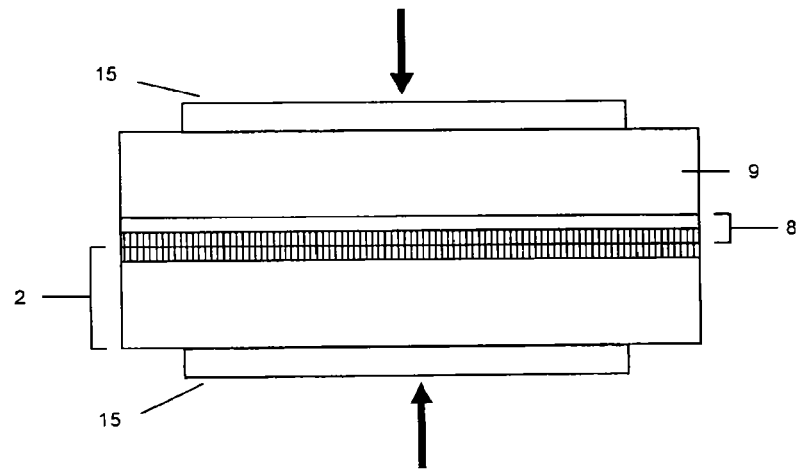
FIG. 11 is a diagram of a wafer bonded with a clamp.
Figure 12:
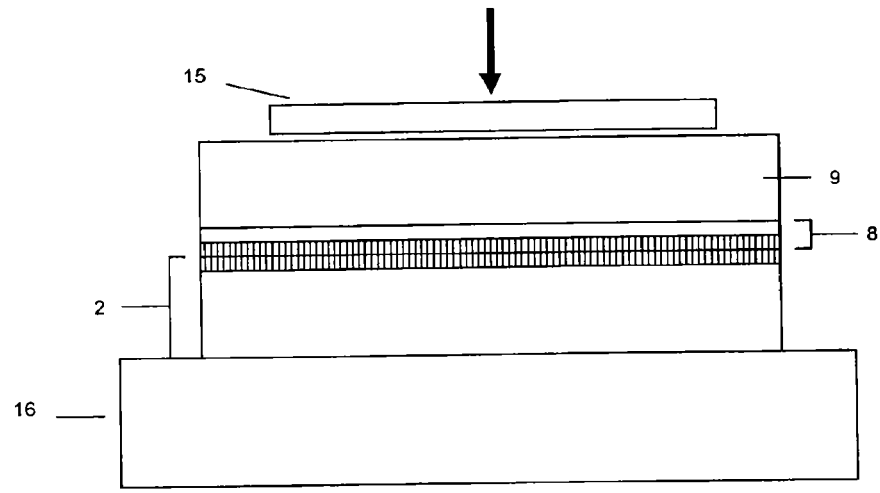
FIG. 12 is another diagram of a wafer bonded with a clamp.
Figure 13:
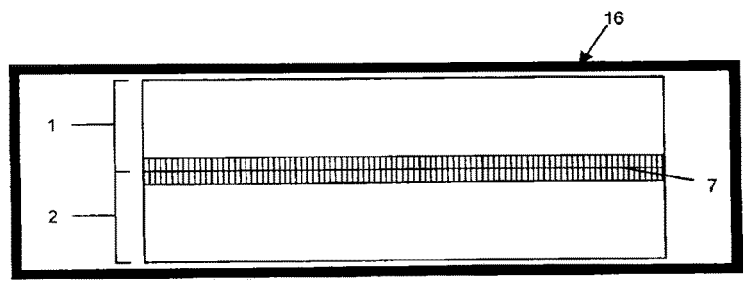
FIG. 13 is a diagram of bonding using a flexible container.

The attachment of third wafer 9 can be with a variety of methods, for example with a direct bond, as described in application Ser. No. 09/505,283, or a clamp 15 as shown in FIG. 11. If with a direct bond, the attachment may include the addition of bonding layers on wafer 9 and/or thinned portion 8. If with a clamp, clamp 15 is shown in FIG. 11 with the external pressure applied to both sides of wafer stack represented by the arrows. This can be done by applying external pressure from both sides as shown in FIG. 11 or by applying external pressure from one side with opposing side restrained by a chuck 16 as shown in FIG. 12. Third wafer 9 preferably has a CTE comparable to wafer 2 to prevent excessive stress during subsequent heating to form 3D interconnections. For example, if wafer 1 is GaN/sapphire, and wafer 2 is silicon CMOS, third wafer 9 can be silicon. The workable range of the difference in CTE depends on the materials, their area and their thicknesses. For example, when bonding 200 mm diameter silicon wafers and using silicon oxide and copper as insulating and conductive bond materials, respectively, it is preferable to have a difference in CTE less than 0.5 ppm/° C. When working with larger wafers, for example 300 mm wafers, it is preferable to have a smaller difference in CTE less than 0.3 ppm/° C. and when working with smaller wafers, for example 200 mm wafers, it is possible to have a larger difference in CTE less than 1.0 ppm/° C. When working with bond materials with a smaller difference in CTE, for example silicon oxide and nickel, it is preferable to have wafers with a smaller difference in CTE to allow for relatively more heating.

Figure 14:
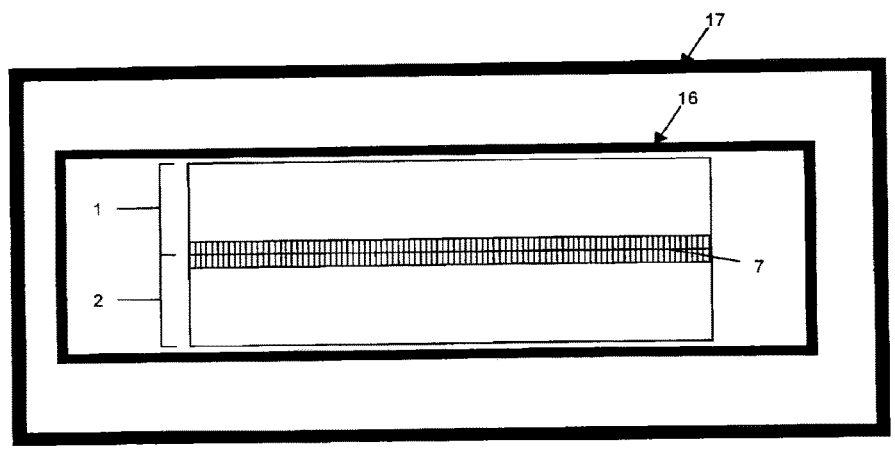
FIG. 14 is a diagram of applying pressure to the flexible container of FIG. 13.
Figure 15:
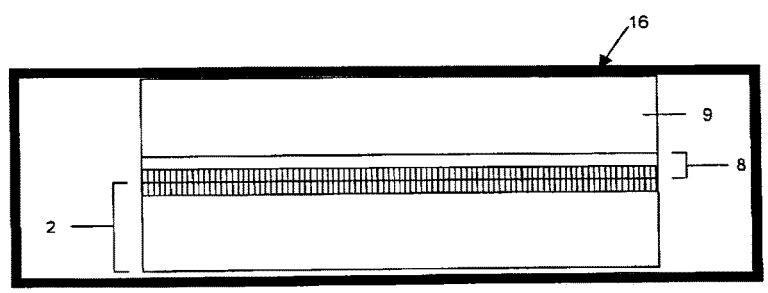
FIG. 15 is a diagram of bonding using a flexible container.
Figure 16:
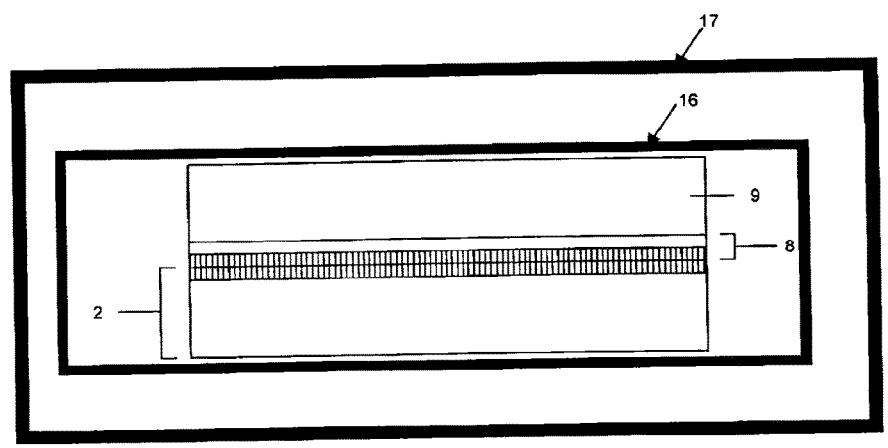
FIG. 16 is a diagram of applying pressure to the flexible container of FIG. 15.

A flexible clamping arrangement as shown in FIGS. 13-16, can be used to assist in holding the bonded wafers together during heating while in addition accommodating bowing of the wafers which will naturally occur during heating due to the CTE difference of the wafers. This method can be applied to the first bond of two wafers of FIG. 2 with different CTEs (shown with flexible clamp methods in FIGS. 13 and 14), and also to the 3 layer stack of FIG. 4 with two thick CTE matched materials bonded to the thinner layer of different CTE material sandwiched between the two thicker layers (shown with flexible clamp methods in FIGS. 15 and 16). The flexible clamping arrangement consists of 2 layers of flexible material, for example a silicone rubber sheet, enclosing the bonded materials, and sealed at the edges forming a sealed envelope 16. The material used must be able to withstand the temperature that is to be applied to the bonded layers. Pressure is applied either by evacuating the space within the flexible material envelope, thus applying atmospheric pressure evenly around the outside of the structure (FIGS. 13, 15), and/or by putting the flexible envelope and its contents into a high pressure chamber 17, and applying the desired pressure evenly around the envelope and its contents to compress the layers together (FIGS. 14, 16). In both cases, heat is then applied to the envelope and its contents to strengthen the bond(s) while bowing of the bonded stack is allowed to accommodate CTE mismatch and prevent breaking of the layers.

The bonded stack of wafers 1, 2, and 3 shown in FIG. 4 can then be heated to higher temperatures than previously to form 3D interconnections if interconnections have not already been made due to a lack of temperature. For example, 300-350° C. may be required if wafer 1 is GaN/sapphire, wafer 2 is silicon CMOS, wafer 3 is silicon, and the metal is nickel. This ability to heat to a higher temperature has been enabled by replacing a major portion of wafer 2 that is CTE mis-matched to wafer 1 with wafer 9 that is CTE matched to wafer 1. These higher temperatures are now possible to facilitate electrical interconnections with higher temperatures due to this reduction in CTE mis-match. These higher temperatures were previously not possible due to CTE induced strain that would break the bond between the insulating portions or break the bonded wafers.

Figure 5:
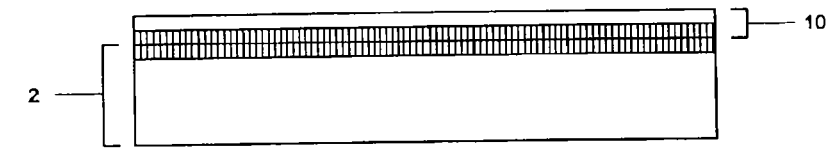
FIG. 5 is a diagram of a thinned portion of a direct metal bonded pair after removal of a stiffening wafer.
Figure 6:
FIG. 6 is a diagram of a second embodiment including filled vias.
Figure 7:
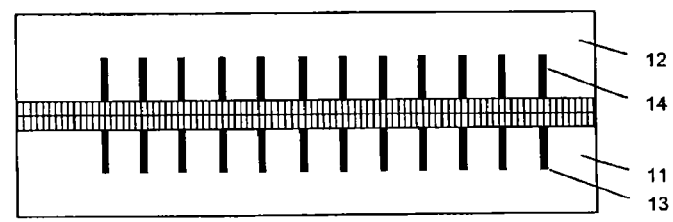
FIG. 7 is a diagram of two wafers bonded each having filled vias.

After heating, wafer 3 can be removed as shown in FIG. 5, to leave portion 10. Portion 10 may be essentially thinned portion 8 or may be thicker, for example if a bonding layer portion of wafer 9 is not removed or may be thinner, for example if a bonding layer portion of thinned portion 8 is removed. Removal can be with a variety of methods, for example, one or a combination of backgrinding, chemo-mechanical polishing, or etching. Such techniques may be used when wafer 3 is silicon. Wafer 3 may also not be removed, for example if wafer 3 has a useful function, for example as part of a packaging function. A second embodiment of the method according to the invention will now be described. Either one or both of wafer 11 and wafer 12 may contain a via or vias 13 filled with metal that extend through all, most, or a portion of either one or both of wafer 11 and wafer 12, respectively as shown in FIGS. 6 and 7 for filled vias 13 and 14 that extend through about half of wafer 11 and wafer 12, respectively, and at a larger pitch than the conductive material at the bond interface. The vias may be electrically connected to the conductive material at the bond interface. If both wafer 11 and wafer 12 have filled vias, the filled vias may be opposed during the alignment and placement of wafer 1 and wafer 2 together as shown for filled vias 13 and 14, respectively. Vias 13 and 14 may also be not opposed.

Figure 8:
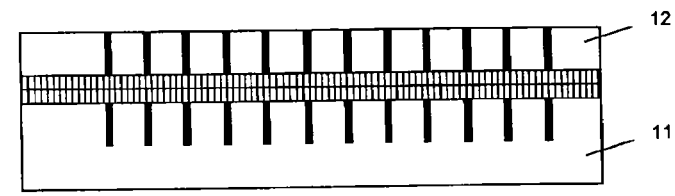
FIG. 8 is a diagram of showing the structure of FIG. 7 with the vias exposed.
Figure 9:
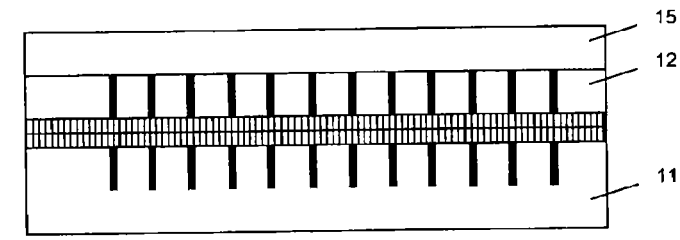
FIG. 9 shows the attachment of an additional substrate to the structure of FIG. 8.

After wafer 12 is thinned, vias may be exposed as shown in FIG. 8 or may have a very thin residual portion of wafer 1 preventing exposure. For example, the residual wafer 12 thickness may be less than 100 microns. Heating of the structure in FIG. 8 or a similar structure with residual portion on filled vias will result in additional vertical and horizontal stress than described previously for the metal bonding due to the expansion coefficient difference between the filled vias surrounding material. The lack of a wafer 3 to inhibit relaxation of this stress can distort the direct metal bond interface and prevent proper bonding. The attachment or bonding of a wafer 15 as shown in FIG. 9 can inhibit relaxation of this stress and mitigate distortion of the metal bond interface and promote 3D electrical interconnections across the metal bond interface. As in embodiment 1, this wafer 15 is preferably made from material with a CTE match to that of wafer 11.

Numerous modifications and variations of the present invention are possible in light of the above teachings. It is therefore to be understood that within the scope of the appended claims, the invention may be practiced otherwise than as specifically described herein.

The invention claimed is:

1. A method comprising:
   providing a first substrate comprising a first major portion having a first coefficient of thermal expansion, the first substrate comprising a first bonding layer disposed over the first major portion and having a first bonding surface;
   providing a second substrate comprising a second major portion having a second coefficient of thermal expansion that is different than the first coefficient of thermal expansion, the second substrate comprising a second bonding layer disposed over the second major portion and having a second bonding surface;
   directly bonding the first bonding surface of the first substrate to the second bonding surface of the second substrate;
   thinning the second substrate;
   bonding the second substrate to a third substrate;
   heating the first, second, and third substrates after directly bonding the first bonding surface to the second bonding surface, and after bonding the second substrate to the third substrate; and
   removing the third substrate from the second substrate.

2. The method of claim 1, wherein the thinning of the second substrate occurs after the directly bonding the first and second bonding surfaces.

3. The method of claim 1, wherein the directly bonding comprises directly bonding together the first and second substrates at room temperature.

4. The method of claim 3, wherein the heating comprises bringing the first, second, and third substrates to a temperature of at least 150° C.

5. The method of claim 3, wherein the heating comprises bringing the first, second, and third substrates to a temperature in a range of 75° C. to 150° C.

6. The method of claim 1, wherein the first major portion is formed substantially of a first semiconductor material and the second major portion is formed substantially of a second semiconductor material different from the first semiconductor material.

7. The method of claim 1, wherein:
   the first bonding layer comprises a first dielectric layer that defines the first bonding surface, and first metal contact structures are disposed in the first dielectric layer;
   the second bonding layer comprises a second dielectric layer that defines the second bonding surface, and second metal contact structures are disposed in the second dielectric layer; and
   the heating causes at least one of the first metal contact structures to expand and metallically bond with one of the second metal contact structures.

8. The method of claim 1, wherein the directly bonding comprises directly bonding first metal contact structures of the first bonding layer to second metal contact structures of the second bonding layer without an adhesive.

9. The method of claim 8, wherein the directly bonding comprises directly bonding a first nonconductive region of the first bonding layer to a second nonconductive region of the second bonding layer without an adhesive.

10. The method of claim 1, wherein the bonding the second substrate to the third substrate comprises directly bonding the second substrate to the third substrate without an adhesive.

11. The method of claim 1, further comprising heating the first, second, and third substrates while the third substrate is bonded to the second substrate.

12. The method of claim 1, wherein removing the third substrate from the second substrate is performed after the heating.

13. The method of claim 1, wherein a third major portion of the third substrate has a third coefficient of thermal expansion that is substantially equal to the first coefficient of thermal expansion.

14. A method comprising:
    directly bonding a first bonding surface of a first bonding layer of a first substrate to a second bonding surface of a second bonding layer of a second substrate, the first substrate comprising a first major portion having a first coefficient of thermal expansion that is different from a second coefficient of thermal expansion of a second major portion of the second substrate;
    thinning the second substrate;
    bonding the second substrate to a third substrate; and
    removing the third substrate from the second substrate after heating the first, second and third substrates.

15. The method of claim 14, wherein bonding the second substrate to the third substrate comprises directly bonding the second substrate to the third substrate without an adhesive.

16. The method of claim 14, wherein the directly bonding comprises directly bonding first metal contact structures of the first bonding layer to second metal contact structures of the second bonding layer without an adhesive.

17. The method of claim 16, wherein the directly bonding comprises directly bonding a first nonconductive region of the first bonding layer to a second nonconductive region of the second bonding layer without an adhesive.

18. The method of claim 17, wherein the heating causes at least one of the first metal contact structures to expand and metallically bond with one of the second metal contact structures.

19. The method of claim 17, wherein the heating comprises bringing the first, second, and third substrates to a temperature of at least 150° C.

20. The method of claim 17, wherein the heating comprises bringing the first, second, and third substrates to a temperature in a range of 75° C. to 150° C.

21. The method of claim 14, wherein the first major portion is formed substantially of silicon and the second major portion is formed substantially of a material different than silicon.

22. The method of claim 14, wherein a third major portion of the third substrate has a third coefficient of thermal expansion that is substantially equal to the first coefficient of thermal expansion.

* * * * *